United States Patent [19]
Namiki et al.

[11] Patent Number: 5,532,722
[45] Date of Patent: Jul. 2, 1996

[54] IMAGE FORMING DEVICE AND METHOD FOR TRANSFERRING INK USING A HEATED PNEUMATIC DRUM

[75] Inventors: Tomizo Namiki; Tamotsu Suzuki, both of Shizuoka; Yukihide Miyata, Kanagawa, all of Japan

[73] Assignee: Fuji Photo Film Co., Ltd., Kanagawa, Japan

[21] Appl. No.: 205,094

[22] Filed: Mar. 3, 1994

[30] Foreign Application Priority Data

Mar. 3, 1993 [JP] Japan ................................. 5-42946

[51] Int. Cl.⁶ .................................................. G01D 15/10
[52] U.S. Cl. ........................... 347/153; 347/262; 347/264; 355/309
[58] Field of Search .................................. 346/108, 160; 355/66, 308, 309, 321; 347/262, 264, 153

[56] References Cited

U.S. PATENT DOCUMENTS

| | | | |
|---|---|---|---|
| 4,033,689 | 7/1977 | Washio et al. | 355/66 |
| 4,590,486 | 5/1986 | Yana | 347/105 |
| 5,082,383 | 1/1992 | Ohishi | 347/179 |

FOREIGN PATENT DOCUMENTS

| | | |
|---|---|---|
| 0350195 | 1/1990 | European Pat. Off. |
| 0460561 | 11/1991 | European Pat. Off. |
| 9207716 | 5/1992 | WIPO |

OTHER PUBLICATIONS

Patent Abstracts of Japan, vol. 12, No. 371 (M–748y) 5 Oct. 1988.
Patent Abstracts of Japan, vol. 15, No. 395 (P–1260) 7 Oct. 1991.

*Primary Examiner*—Benjamin R. Fuller
*Assistant Examiner*—Raquel Yvette Gordon
*Attorney, Agent, or Firm*—Sughrue, Mion, Zinn, Macpeak & Seas

[57] ABSTRACT

An image forming device having a rotating drum around which an image forming material is trained, an ink sheet conveying mechanism which conveys an ink sheet synchronously with rotation of the rotating drum, an ink transfer device which fits the image forming material and the ink sheet together and effects either heating or pressing such that ink is transferred onto the image forming material, and a fitting/conveying device which moves an image receiving material with respect to a peripheral surface of the rotating drum synchronously with the rotation of the rotating drum and which fits the image forming material and the image receiving material together and applies either a predetermined pressure or a predetermined temperature so that ink is transferred from the image forming material to the image receiving material; and an image forming method including above-described processes. Exposure need be effected only once for each color, and the image forming materials can be used repeatedly. Therefore, a plurality of color proofs can be prepared from a single original plate, and time involved in preparing the color proofs can be reduced.

19 Claims, 9 Drawing Sheets

IMAGE FORMING DEVICE AND METHOD FOR TRANSFERRING INK USING A HEATED PNEUMATIC DRUM

BACKGROUND OF THE INVENTION

1. Field of the Invention

The present invention relates to an image forming device and method in which, after inks corresponding to respective colors have been transferred onto an image forming material, a color image corresponding to a print original image is formed on an image receiving material by the inks of the respective colors being successively transferred onto the image receiving material.

2. Description of the Related Art

At a printer, when color printing a large amount of printed matter in which it is necessary to check the color in particular, e.g., calendars, picture books, photograph books, color advertisements included in newspapers (so-called "inserted bills") and the like, an advance check is performed by using color proofs (proofing) before the actual printing is effected at the printer.

In order to print several color proofs during proofing, photosensitive materials are used which are cheaper than and less printable than a photosensitive lithographic printing plate (PS plate) used in actual printing.

The printed matter finished by proofing is distributed to respective persons for checking. After various checks have been performed, the original is corrected.

However, in conventional proofing devices, there is a dispersion in the quality of the printed matter obtained when several color proofs are printed. Therefore, before the color proofs are distributed to the respective persons for checking, color proofs having matching quality must be selected. Further, because printing of the color proofs is carried out by using the ink used during actual printing, the operators' hands become dirty, maintenance of the device is complex, and workability is insufficient.

In recent years, a method of preparing color proofs has been used in which a photosensitive material, in which a pigment is included in advance, and a color separated print original corresponding to the pigment are exposed and developed while in a superposed state. Photosensitive materials on which the color separated images of the respective colors are recorded are thereby obtained. These color separated images are successively transferred to a single image receiving film. Next, the color proofs are prepared by the image forming device ("Color Art" [trade name] manufactured by Fuji Photo Film Co., Ltd.) which carries out the actual transfer onto the printing paper (actual paper).

In accordance with such an image forming device, because ink is not used, there are no operational drawbacks, such as the operators' hands being dirtied or the like, and the maintainability of the device also improves. Further, because the quality is stable, there is no dispersion of the images on the finished actual paper.

However, although the conventional drawbacks (unstable quality, maintainability, and the like) have been solved in the preparation of color proofs by the above-described image forming device, each time a single color proof is prepared, exposure must be effected by using the color separated originals of each color. Therefore, there are drawbacks in that much time and labor is involved.

SUMMARY OF THE INVENTION

In view of the aforementioned, an object of the present invention is to provide an image forming device and an image forming method in which, because exposure need be effected only once for each color and image forming materials (photosensitive materials) can be used repeatedly, a plurality of color proofs can be prepared from a single original plate, and time and labor involved in preparing the color proofs can be reduced.

The first aspect of the present invention is an image forming device comprising: a rotating drum around whose peripheral surface an image forming material is trained, ink receiving portions and ink non-receiving portions being formed on the image forming material by at least one of exposure of a color separated original by active light and developing processing effected after the exposure, the ink receiving portions and the ink non-receiving portions corresponding to the color separated original; an ink sheet conveying mechanism which conveys an ink sheet, in which an ink layer is provided on a supporting body, synchronously with rotation of the rotating drum; ink transfer means for fitting together the image forming material, which is trained around the rotating drum, and the ink sheet, which is conveyed by the ink sheet conveying mechanism, and for transferring ink from the ink sheet to the ink receiving portions of the image forming material by effecting at least one of heating and pressing the image forming material and the ink sheet in a state in which the image forming material and the ink sheet are fit together; and fitting/conveying means, having an image receiving material loading surface, for moving an image receiving material with respect to the peripheral surface of the rotating drum synchronously with the rotation of the rotating drum, and for fitting together the image receiving material with the image forming material to which the ink has been transferred by the ink transfer means, and for applying at least one of a predetermined pressure and a predetermined temperature to the image receiving material and the image forming material so that the ink is transferred from the image forming material to the image receiving material.

The second aspect of the present invention is an image forming device which, after transferring inks corresponding to respective colors of color separated originals of each color to an image forming material, transfers the inks of the respective colors successively onto an image receiving material so that a color image corresponding to the color separated originals is formed on the image receiving material, the image forming device comprising: a rotating drum around whose peripheral surface an image forming material is trained, ink receiving portions and ink non-receiving portions being formed on the image forming material by at least one of exposure of a color separated original by active light and developing processing effected after the exposure, the ink receiving portions and the ink non-receiving portions corresponding to the color separated image, and a first positioning portion, which is engageable with a positioning portion provided at the image forming material, being provided at a portion of the peripheral surface of the rotating drum; a loading stand on which a plurality of the image forming materials are loaded in a stacked and superposed state, the loading stand being provided with a second positioning portion which is engageable with the positioning portion provided at the image forming material; image forming material setting means for removing the image forming material positioned on the loading stand by the second positioning portion, and for moving the image forming material to the rotating drum, and for positioning the image receiving material at the peripheral surface of the rotating drum by using the first positioning portion; holding means for holding the image receiving material set on the peripheral surface of the rotating drum by the image forming material setting means; an ink sheet supply roller supporting an ink sheet, which has a structure in which ink is applied to a belt-shaped supporting body, in a state in which the ink sheet is taken up in a roll; ink transfer means for fitting together the image forming material and the ink sheet, and for effecting at least one of heating and pressing the image forming material and the ink sheet in a state in which the image forming material and the ink sheet are fit together, so that ink is transferred to the ink receiving portions of the image forming material; peeling means for peeling the ink sheet from the image forming material; a take-up roller for taking up and accommodating in a roll shape the ink sheet peeled by the peeling means; tension maintaining means for maintaining the ink sheet between the supply roller and the take-up roller at a predetermined tension; conveying means, provided with a loading surface upon which an image receiving material is loaded, for fitting together and conveying the image forming material on the peripheral surface of the rotating drum and the image receiving material on the loading surface, at a predetermined pressure, by moving in a direction tangent to the peripheral surface of the rotating drum synchronously with rotation of the rotating drum.

The third aspect of the present invention is an image forming method comprising the steps of: training an image forming material around a peripheral surface of a rotating drum, ink receiving portions and ink non-receiving portions being formed on the image forming material by at least one of exposure of a color separated original by active light and developing processing effected after the exposure, the ink receiving portions and the ink non-receiving portions corresponding to the color separated original; conveying an ink sheet, in which an ink layer is provided on a supporting body, synchronously with rotation of the rotating drum; fitting together the image forming material trained around the rotating drum and the ink sheet conveyed by an ink sheet conveying mechanism, and effecting at least one of heating and pressing the image forming material and the ink sheet in a state in which the image forming material and the ink sheet are fit together, so that ink from the ink sheet is transferred onto the ink receiving portions of the image forming material; and moving an image receiving material with respect to the peripheral surface of the rotating drum synchronously with the rotation of the rotating drum, and fitting the image receiving material together with the image forming material to which ink has been transferred by an ink transfer means, and applying at least one of a predetermined pressure and a predetermined temperature to the image forming material and the image receiving material so that ink is transferred from the image forming material to the image receiving material.

In the first aspect and the third aspect of the present invention, ink receiving portions and ink non-receiving portions corresponding to an original are formed on the image forming material by exposing the image forming material via the original or by developing the image forming material after exposure.

The ink sheet is fit to the image forming material in a state in which the image forming material is trained around the peripheral surface of the rotating drum. The ink sheet is structured such that an ink layer is provided on a supporting body, and is fit with the image forming material on the peripheral surface of the rotating drum. Thereafter, the image forming material and the ink sheet are heated and/or pressed at the ink transfer means, and the ink is thereby transferred to only the ink receiving portions of the image forming material.

The image forming material to which ink has been transferred is fit at a predetermined pressure to the image forming material which is conveyed synchronously with the rotation of the rotating drum. In this way, the ink adhering to the image forming material is transferred to the image receiving material.

In general, a color printed image is formed by inks of four colors: C (cyan), M (magenta), Y (yellow) and K (black). Therefore, for example, by successively changing image forming materials, which have been image-exposed by the respective color separated originals and to which ink of the corresponding color has been transferred, and by effecting transfer four times for a single image receiving material, a color image can be formed on the image receiving material. Thereafter, by superposing a paper to be used for actual printing on the image receiving material and applying pressure (and/or heat) thereto, the color proof is finished.

After the inks of the different colors have been transferred to a single image receiving material and one color proof has been formed, the image forming material which has been used once is again trained around the rotating drum, and the appropriate color ink is transferred thereto. The same image can thereby be transferred to a new image receiving material. Therefore, it is not necessary to effect image exposure for each color proof when a plurality are prepared, and a plurality of color proofs can be made in a relatively short time.

In the above-described case, a color image is finished on each image receiving material. However, by using the same image forming material, an image of the same color may be repeatedly transferred in advance onto a plurality of image receiving materials, and then the image of the next color may be transferred onto the image receiving materials. Accordingly, an image forming material which was subject to exposure processing (developing processing) once can be used a number of times. Therefore, for example, between the application of ink to the above-mentioned image forming material and the transfer to ink to the image receiving material, exposure processing (developing processing) may be effected for the next image forming material at a different place. In this way, the work processes can be dispersed, and work efficiency can be greatly improved.

In accordance with the second aspect of the present invention, the image forming material loaded on the loading stand is removed therefrom, is conveyed onto the rotating drum, and is positioned on the rotating drum by the image forming material setting means so as to be trained around and fixed to the peripheral surface of the rotating drum. For example, by providing suction grooves, which run along the periphery of the image forming material, in the peripheral surface of the rotating drum and applying negative pressure to the suction grooves, the image forming material can be sucked to the peripheral surface of the rotating drum. Alternatively, a structure may be provided in which guide members are provided at both axial direction end portions of the rotating drum so that both transverse direction end portions of the image forming material are positioned by the guide members.

In this state, the belt-shaped ink sheet is delivered from the supply roller and is fit to the image forming material at a portion of the peripheral surface of the rotating drum. Thereafter, by heating and/or pressing the image forming material and the ink sheet, ink is transferred to the ink receiving portions of the image forming material.

After the ink has been applied to the image forming material, the belt-shaped ink sheet is peeled from the image forming material by the peeling means. At this time, because the ink has reliably been applied to the ink receiving portions, the ink sheet is peeled from the image forming material at a peeling angle which is less than or equal to a predetermined radius of curvature, in accordance with the properties of the ink or the like. The peeled ink sheet is taken up by a take-up roller. Because a predetermined tension is usually applied to the ink sheet by the tension maintaining means, the ink sheet is not slack, and meandering thereof can be prevented. Further, a crown-shaped roller can be used as the take-up roller in order to prevent meandering.

Thereafter, the image forming material having ink applied to the ink receiving portions thereof is fit with the image receiving material which is conveyed by the conveying means. By applying a predetermined pressure and/or predetermined heat to the image forming material and the image receiving material, a color image is formed on the image receiving material by the ink.

Accordingly, processes such as the process of removing the image forming material from the loading stand and training it around the rotating drum, the process of conveying the belt-shaped ink sheet from the supply roller to the take-up roller at a predetermined tension, the process of peeling the ink sheet from the image forming material, and the process of fitting the image forming material with the image receiving material can be effected automatically. Therefore, it suffices that an operator only sets the image forming material at the loading stand and sets the image receiving material at the loading surface, and workability is therefore good.

As described above, the image forming device and method relating to the present invention provide superior effects in that a plurality of color proofs can be prepared from a single original plate on which an image is formed, and the time necessary to prepare the plurality of color proofs can be reduced.

DESCRIPTION OF THE PREFERRED EMBODIMENTS

First Embodiment

Figure 1:
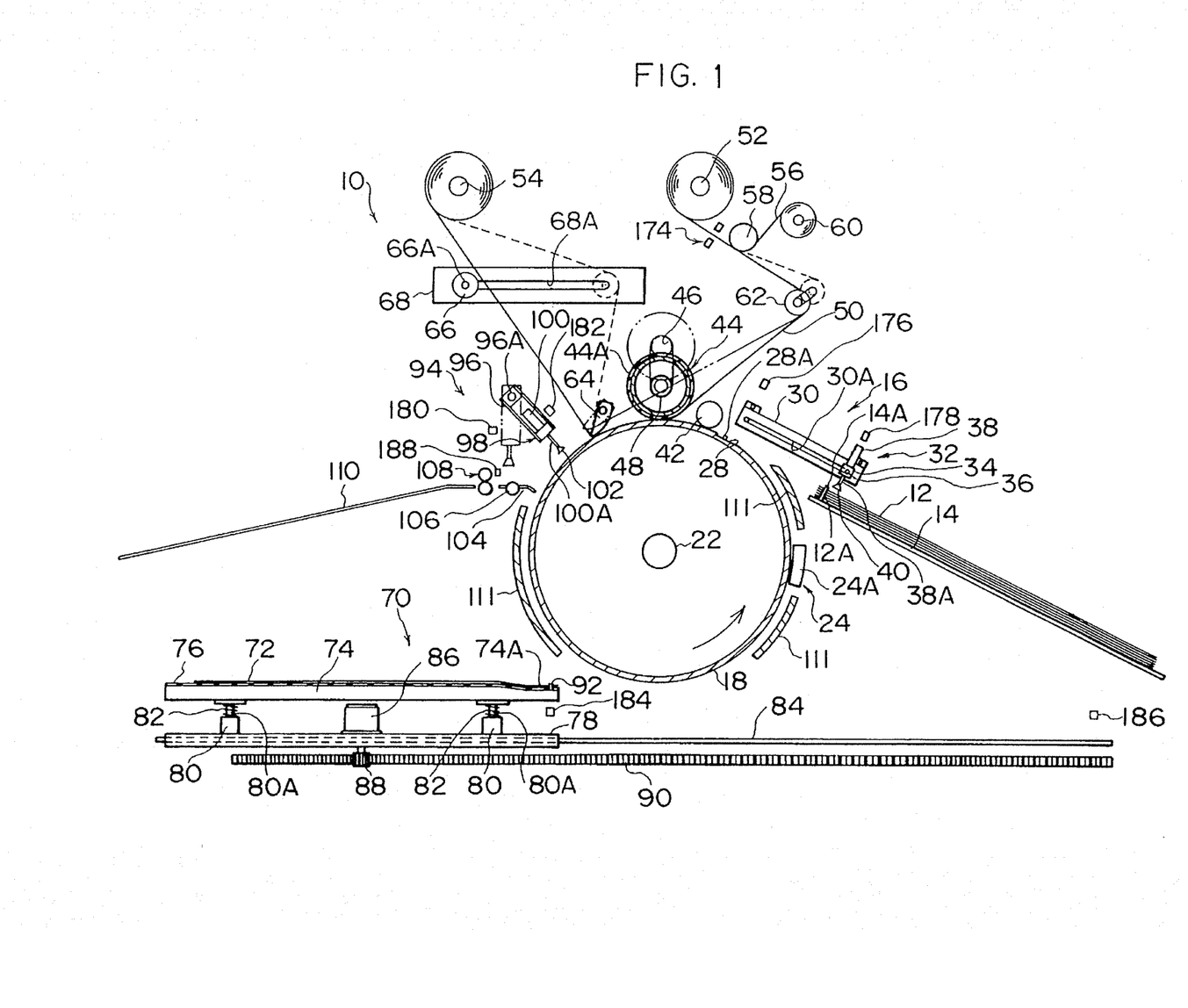
FIG. 1 is a schematic structural view of an image forming apparatus relating to a first embodiment.

An image forming apparatus 10 which is a first embodiment of the present invention is illustrated in FIG. 1.

A loading stand 14, on which photosensitive sheets 12 serving as image forming materials are placed, is disposed at the right side of FIG. 1. The photosensitive sheets 12 are loaded on the loading stand 14 so as to be stacked and superposed one on top of the other. The photosensitive sheets 12 have already been subject to exposure processing and developing processing such that ink receiving portions, which correspond to images of respective colors (C, M, Y, K) forming a color image, as well as ink non-receiving portions are formed on the respective surfaces of the photosensitive sheets 12.

Two positioning holes 12A (used for registering) are formed at one end portion of the photosensitive sheet 12.

First pins 14A corresponding to the positioning holes 12A are provided at the loading stand 14. The photosensitive sheets 12 are placed on the loading stand 14 with the first pins 14A inserted in the positioning holes 12A so that a plurality of the photosensitive sheets 12 are stacked and superposed in an arranged state.

A photosensitive sheet conveying unit 16 is disposed above the loading stand 14. The photosensitive sheet conveying unit 16 functions to suck the uppermost photosensitive sheet 12 stacked on the loading stand 14 and move this sheet onto the peripheral surface of a drum 18.

The drum 18 is made of metal, and the interior thereof is hollow. The drum 18 is rotated counterclockwise in FIG. 1 by the driving force of a motor 20 (see FIG. 2). A heater 22, such as a halogen lamp or the like, is disposed at the axially central portion of the drum 18. When the heater 22 is lit, the drum 18 is heated and functions as a so-called heat roller. Due to the heater 22, the temperature of the peripheral surface of the drum 18 is heated to a maximum of about 100° C. Instead of the halogen heater 22, heated oil may be circulated so as to maintain the temperature of the peripheral surface of the drum 18.

Unillustrated suction grooves are formed in a frame-shape in the peripheral surface of the drum 18 so that the peripheral portions (non-image portions) of the photosensitive sheet 12 trained around the peripheral surface of the drum 18 are sucked and held thereto by negative pressure.

In order to accurately set the photosensitive sheet 12 on the peripheral surface of the drum 18, a mark for positioning (usually called a register mark) is recorded on a portion of the photosensitive sheet 12. A mechanism for photoelectrically detecting the mark is disposed so as to correspond to the peripheral surface of the drum 18. It is preferable that, when the position of the mark deviates to a certain extent or more with respect to the drum 18, a warning is given to reset the photosensitive sheet 12 onto the peripheral surface of the drum 18. Further, in order to achieve this object, the drum 18 may be rotated before ink transfer so that color shear can be prevented.

A rotary encoder 24 is disposed so as to correspond to the peripheral surface of the drum 18. The rotary encoder 24 is formed of a rotary plate (unillustrated), on which black and white bars are alternately disposed at one end portion in the axial direction of the drum 18, and a sensor portion 24A which corresponds to the rotary plate. At the sensor portion 24A, the rotation of the drum 18 is read by pulse waveform. The sensor portion 24A is connected to a control device 26, which will be described later, so that the rotational position (angle) of the drum 18 is recognized at the control device 26.

A notch portion 28 is formed at one portion of the peripheral surface of the drum 18. Second pins 28A protrude from the bottom portion of the notch portion 28. The photosensitive sheet conveying unit 16 moves the photosensitive sheet 12 until the second pins 28A are inserted into the positioning holes 12A of the photosensitive sheet 12.

The photosensitive sheet conveying unit 16 includes a pair of parallel guide plates 30 (only one of which is illustrated in FIG. 1). An elongated hole 30A is formed in each of the guide plates 30. Each of the elongated holes 30A guides a pin 36 which protrudes from a block 34 of a suction cup unit 32. In this way, the suction cup units 32 are movable along the elongated holes 30A. An air cylinder 38 is mounted to the block 34. A suction cup 40 is attached to the tip end of an extending/retracting rod 38A of the air cylinder 38. The suction cups 40 can be set in a sucking state and a suction canceled state due to an unillustrated negative pressure generating means.

Accordingly, when the extending/retracting rods 38A are extended when the suction cup units 32 are at the right ends in FIG. 1 of the elongated holes 30A, the suction cups 40 are fit to the uppermost photosensitive sheet 12. In this state, by driving the negative pressure generating means, the suction cups 40 can suck the photosensitive sheet 12.

When the extending/retracting rods 38A are retracted while the photosensitive sheet 12 is being sucked, the photosensitive sheet 12 is lifted upward so that the positioning holes 12A are separated from the first pins 14A.

Here, the suction cup units 32 are conveyed along the elongated holes 30A to the left ends in FIG. 1. By extending the extending/retracting rods 38A again, the photosensitive sheet 12 is brought toward the peripheral surface of the drum 18. By canceling the suction of the suction cups 40 after the second pins 28A have been inserted into the positioning holes 12A, the photosensitive sheet 12 is set at the drum 18. The photosensitive sheet conveying unit 16 is interlocked with the drum 18 so as to correspond to the rotational position of the drum 18 and is driven.

The drum 18 is driven so as to rotate in the counterclockwise direction in FIG. 1. As a result, the photosensitive sheet 12 which is engaged with the drum 18 due to the second pins 28A is gradually trained around the peripheral surface of the drum 18 as the drum 18 rotates. A squeeze roller 42 is disposed downstream of the photosensitive sheet conveying unit 16 in the direction of rotation of the drum 18. The photosensitive sheet 12 is trained around the drum 18 while being fit thereto by the squeeze roller 42. Instead of the squeeze roller 42, a brash which slidingly contacts the peripheral surface of the drum 18 can be used.

A heating/pressing roller 44 serving as a ink transfer means is disposed downstream of the squeeze roller 42. The heating/pressing roller 44 is movable along an elongated hole 46 in vertical directions in FIG. 1 so as to be able to contact and separate from the drum 18.

The interior of the heating/pressing roller 44 is hollow, and a heater 48, such as a halogen lamp or the like, is accommodated therein. The peripheral surface of the heating/pressing roller 44 is heated to a maximum of about 150° C. by the heater 48.

The outer periphery of the heating/pressing roller 44 is covered with a rubber sheet layer 44A so as to be slightly elastic.

When the heating/pressing roller 44 is nearest to the drum 18, the heating/pressing roller 44 pushes an ink sheet 50 toward the peripheral surface of the drum 18. Further, when the heating/pressing roller 44 is separated from the drum 18, the heating/pressing roller 44 does not contact the ink sheet 50.

In the ink sheet 50, an ink layer is provided at one surface of an elongated supporting body. One end of the ink sheet 50 is fixed to a supply roller 52, and the other end thereof is fixed to a take-up roller 54.

The unused ink sheet 50 is completely wound around the supply roller 52, and the used ink sheet 50 is taken up by the take-up roller 54. Ink sheets 50 of four types of dyes are provided and are changed so as to correspond to the color separated image recorded on the photosensitive sheet 12 which is trained around the drum 18.

A protective film 86 is adhered to the ink layer side of the ink sheet 50 which is wound around the supply roller 52. Each time the ink sheet 50 is pulled out from the supply roller 52, the protective film 56 is peeled off and is taken up by a protective film take-up roller 60 via a roller 58. If an operator first manually sets the leading end portion of the protective film 56 at the protective film take-up roller 60, the rest of the protective film 56 can be peeled automatically.

The ink sheet 50, which has been pulled out from the supply roller 52 and from which the protective film 56 has been peeled, is supplied to a vicinity of the peripheral surface of the drum 18 via a tension roller 62.

The tension roller 62 is urged by the urging force of an unillustrated urging means in the direction of the position illustrated by the chain line in FIG. 1, and usually applies a fixed tension to the ink sheet 50. Accordingly, regardless of the position of the heating/pressing roller 44, slack in the ink sheet 50 can be prevented. Further, the take-up roller 54 is processed in a crown configuration so that the ink sheet 50 can be prevented from meandering.

The conveying direction of the ink sheet 50 which has arrived downstream of the heating/pressing roller 44 is switched toward the direction of the take-up roller 54 by a peeling claw 64.

The peeling claw 64 peels the ink sheet 50 from the drum 18 (actually, from the photosensitive sheet 12 which is trained around the drum 18) at a radius of curvature which is less than a predetermined radius of curvature. The interior of the peeling claw 64 is hollow. By having a cooled liquid flow into the interior of the peeling claw 64, peeling can be effected smoothly. A small diameter roller may be used instead of the peeling claw 64.

A training roller 66 is disposed between the peeling claw 64 and the take-up roller 54. A shaft 66A of the training roller 66 is guided along elongated holes 68A provided in a pair of parallel guide plates 68 (only one of which is illustrated in FIG. 1) such that the training roller 66 is able to move in left and right directions in FIG. 1.

When the training roller 66 is at the left end in FIG. 1, the peeling angle of the ink sheet 50 is substantially 90 degrees. When the training roller 66 is at the right end in FIG. 1, the peeling angle of the ink sheet 50 is substantially 45 degrees. Namely, the angle at which the ink sheet 50 is peeled from the drum 18 can vary from 45 degrees to 90 degrees in accordance with the position of the training roller 66.

The heating/pressing roller 44 is moved in the direction of being fit to the drum 18, synchronously with the training of the photosensitive sheet 12 around the drum 18 and the counterclockwise rotation of the drum 18. At this time, because the ink sheet 50 is also moved toward the drum 18, the ink sheet 50 is fit onto the surface of the photosensitive sheet 12. Because the drum 18 and the heating/pressing roller 44 are respectively heated to the predetermined temperatures, the photosensitive sheet 12 and the ink sheet 50 are pressed and heated at a predetermined pressure and a predetermined temperature so that ink is transferred to the ink receiving portions of the photosensitive sheet 12.

The photosensitive sheet 12, onto whose ink receiving portions ink has been transferred, is rotated counterclockwise in FIG. 1 together with the rotation of the drum 18 so as to reach the bottom portion of FIG. 1.

An image receiving sheet conveying unit 70 is disposed beneath the drum 18. The image receiving sheet conveying unit 70 includes a loading stand 74 on which an image receiving sheet 72 is loaded. A rubber sheet 76 is provided on the top surface of the loading stand 74. The image receiving sheet 72 on the loading stand 74 is positioned in the same way as the previously-described photosensitive sheet 12 is positioned onto the photosensitive sheet loading stand 14. For example, after the image receiving sheet 72 is squeezed by a roller or a brush, a peripheral portion of the image receiving sheet 72 is sucked and fixed so that the image receiving sheet 72 can be fit to the loading stand 74. The loading stand 74 on which the image receiving sheet 72 is placed is heated to a maximum of about 100° C. by an unillustrated heating means.

The loading stand 74 is supported to a moving stand 78 via air cylinders 80. Namely, the loading stand 74 is usually supported in a state in which extending/retracting rods 80A of the air cylinders 80 are extended due to the urging force of compression coil springs 82 attached to the extending/retracting rods 80A.

When the air cylinders 80 are operated, the extending/retracting rods 80A are retracted against the urging force of the compression coil springs 82 so that the heightwise position of the loading stand 74 can be lowered.

The moving stand 78 is guided by a pair of guide rails 84 (only one of which is illustrated in FIG. 1) so as to be movable in left in right directions of FIG. 1 in a direction tangent to the drum 18.

A driving motor 86 is attached to the central portion of the moving stand 78. The drive shaft of the driving motor 86 penetrates through the moving stand 78 and projects out from the bottom surface thereof. A pinion gear 88 is attached to the projecting end, and meshes with a rack 90 which is disposed parallel to the guide rails 84. Accordingly, the moving stand 78 moves along the guide rails 84 due to the driving force of the driving motor 86.

A stepped portion 74A which is thin is formed at the leading end portion of the loading stand 74 in the conveying direction (the right end portion of the loading stand 74 in FIG. 1). A pin 92 is formed at the stepped portion 74A. The pin 92 is inserted into a hole for positioning which is provided in the image receiving sheet 72. The image receiving sheet 72 approaches the drum 18 in the state in which the image receiving sheet 72 is positioned by the pin 92.

The rotation of the drum 18 and the movement of the moving stand 78 are synchronous so that the leading end of the photosensitive sheet 12 trained around the drum 18 and the leading end of the image receiving sheet 72 correspond to each other and are superposed. At this time, due to the urging force of the compression coil springs 82 which are attached to the extending/retracting rods 80A of the air cylinders 80, predetermined pressure is applied to the photosensitive sheet 12 and the image receiving sheet 72 which are superposed. The ink adhering to the photosensitive sheet 12 is thereby transferred to the image receiving sheet 72.

When the ink sheet 50 is again fit to the photosensitive sheet 12 whose ink has been transferred to the image receiving sheet 72, and the photosensitive sheet 12 and the ink sheet 50 are heated and pressed, ink can be transferred again to the ink receiving portions of the photosensitive sheet 12. Namely, a single photosensitive sheet 12 can be used repeatedly.

In this device, photosensitive sheets 12, on each of which a color separated original for a color has been exposed, are changed and trained successively around the drum 18, and ink is transferred by using ink sheets 50 of colors corresponding thereto. Thereafter, by fitting the photosensitive sheets 12 to a single image receiving sheet 72, the images of the four colors necessary to form a color image (C, M, Y, K) are transferred so as to be superposed one on top of the other. Therefore, four round trips of the moving stand 78 result in a single color image. During the return movement of the round trip operation, the air cylinders 80 are operated and the loading stand 74 is lowered so that the loading stand 74 does not contact the drum 18.

When the device is used in this manner, it is necessary to remove the photosensitive sheet 12 from the drum 18 each time one transfer has been completed. Therefore, the photosensitive sheet 12 whose ink has been transferred onto the image receiving sheet 72 is peeled by a photosensitive sheet peeling unit 94 disposed on the left side of the drum 18 in FIG. 1.

In the photosensitive sheet peeling unit 94, a suction cup unit 98 is mounted to a bracket 96 which is pivotable around a shaft 96A. An air cylinder 100 is mounted to the suction cup unit 98. A suction cup 102 is attached to the end of an extending/retracting rod 100A of the air cylinder 100. The suction cup 102 is made able to suck by operation of an unillustrated negative pressure generating means.

When the leading end of the photosensitive sheet 12, i.e., the second pins 28A, is positioned in the vicinity of the suction cup 102, the air cylinder 100 is operated so that the extending/retracting rod 100A is extended and the suction cup 102 is fit to the surface of the photosensitive sheet 12. In this state, the photosensitive sheet 12 can be sucked and held due to operation of the negative pressure generating means.

The bracket 96 is pivoted to the position illustrated by the imaginary line in FIG. 1 in the state in which the photosensitive sheet 12 is sucked and held by the suction cup 102 and the extending/retracting rod 100A is retracted.

A guide plate 104 and a discharge roller 106 are disposed beneath the position illustrated by the imaginary line. Further, a pair of nip rollers 108, which can pivot due to driving force, are disposed downstream of the guide plate 104 and the discharge roller 106.

When the sucking of the photosensitive sheet 12 by the suction cup 102 is canceled after the bracket 96 has reached the position indicated by the imaginary line in FIG. 1, the photosensitive sheet 12 is supported by the guide plate 104 and the delivery roller 106 as the drum 18 rotates. The photosensitive sheet 12 reaches the nip rollers 108, is nipped thereby, and is delivered to a removal tray 110.

Heat shielding plates 111 are disposed along the peripheral surface of the drum 18 at open regions at the periphery of the drum 18 where the photosensitive sheet conveying unit 16, the image receiving sheet conveying unit 70, the photosensitive sheet peeling unit 94 and the pulse encoder 24 are not disposed.

Figure 2:
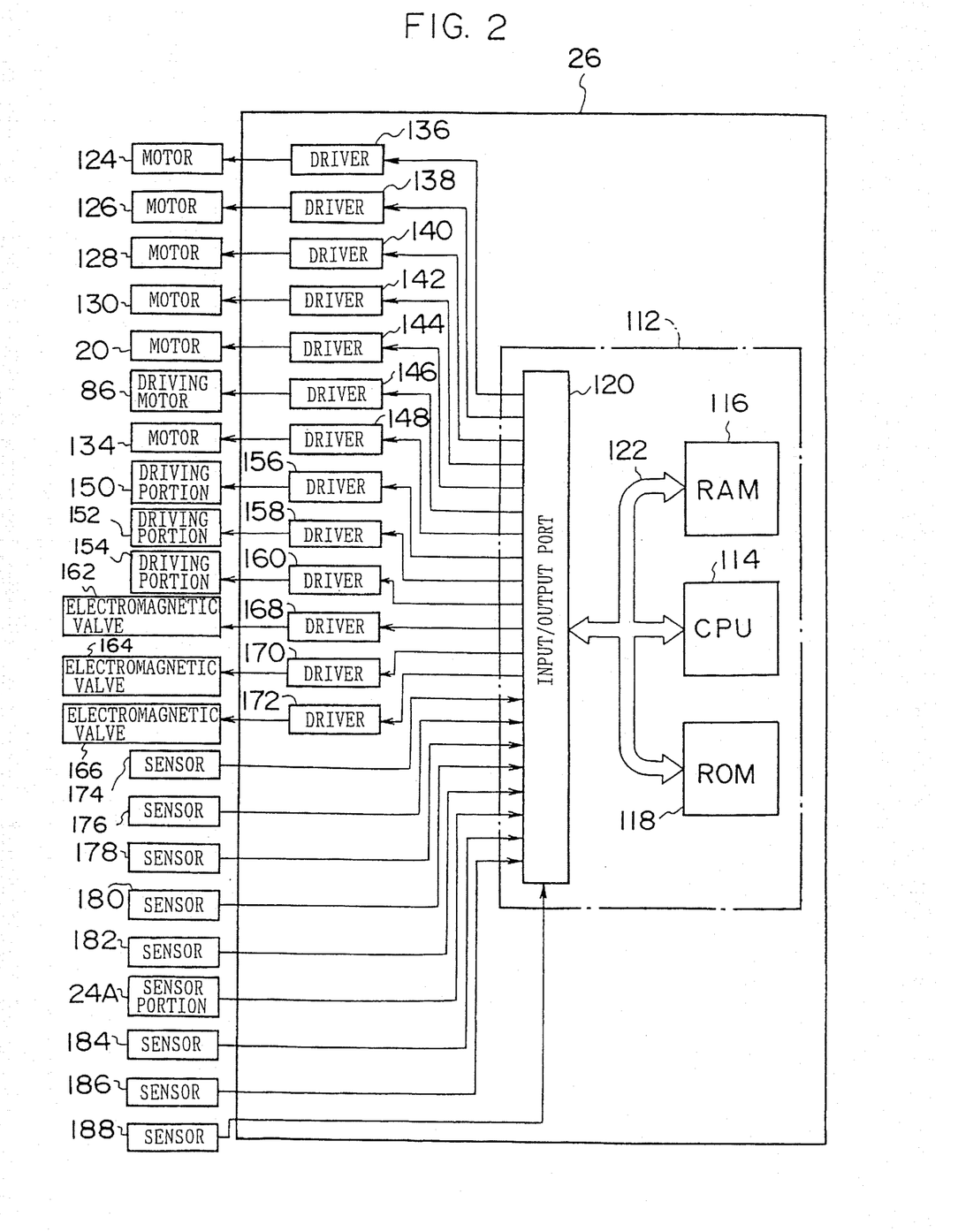
FIG. 2 is a control block diagram of driving systems relating to the first embodiment.

A control block diagram of the driving systems of the image forming device 10 is illustrated in FIG. 2.

The control device 26 includes a microcomputer 112. The microcomputer 112 is formed by a CPU 114, a RAM 116, a ROM 118, an input/output port 120 and busses 122 such as data busses or control busses which connect these components of the microcomputer 112.

A motor 124 which rotates the supply roller 52, a motor 126 which rotates the take-up roller 54, a motor 128 which rotates the protective film take-up roller 60, a motor 130 which rotates the heating/pressing roller 44, the motor 20 which rotates the drum 18, the driving motor 86, and a motor 134 which drives the nip rollers 108 are connected to the input/output port 120 via drivers 136, 138, 140, 142, 144, 146, and 148, respectively.

Driving portions 150, 152, 154 are connected to the input/output port 120 via drivers 156, 158, 160, respectively. The driving portion 150 is provided to move the suction cup units 32 of the photosensitive sheet conveying unit 16 along the elongated holes 30A. The driving portion 152 is provided to pivot the bracket 96 of the photosensitive sheet peeling unit 94. The driving portion 154 is provided to move the training roller 66 along the elongated holes 68A.

Electromagnetic valves 162, 164, 166, which operate the air cylinders 38, 80, 100, are connected to the input/output port 120 via drivers 168, 170, 172, respectively.

A sensor 174, sensors 176, 178, sensors 180, 182, the sensor portion 24A, sensors 184, 186, and a sensor 188 are connected to the input/output port 120 so as to form an input system, in contrast to the above-described output system. The sensor 174 detects the trailing end of the ink sheet 50 which is pulled out from the supply roller 52. The sensors 176, 178 detect the left and right end positions of the suction cup units 32 of the photosensitive sheet conveying unit 16. The sensors 180, 182 detect the positions at both ends of the rotation of the bracket 96 of the photosensitive sheet peeling unit 94. The sensor portion 24A of the rotary encoder 24 detects the rotational position of the drum 18. The sensors 184, 186 detect the left and right end positions of the loading stand 78 of the image receiving sheet conveying unit 70. The sensor 188 detects the leading end portion of the photosensitive sheet 12 at the upstream side of the nip rollers 108 of the photosensitive sheet peeling unit 94.

Operation of the first embodiment will be described hereinafter in accordance with the flowchart of FIG. 3.

First, in step 200, the respective driving systems are set at their original positions. The process proceeds to step 202 where the halogen lamps 22, 48 are lit so that the heating of the drum 18 and the heating/pressing roller 44 begins.

In subsequent step 204, the photosensitive sheet conveying unit 16 is operated. Namely, due to the setting of the original positions, the suction cup units 32 are at the right ends in FIG. 1 of the elongated holes 30A, and the extending/retracting rods 38A are extended so that the suction cups 40 are fit to the uppermost photosensitive sheet 12. In this state, due to the driving of the negative pressure generating means, the suction cups 40 can suck the photosensitive sheet 12.

Thereafter, the extending/retracting rods 38A are retracted so that the photosensitive sheet 12 is separated from the first pins 14A. The suction cup units 32 are conveyed along the elongated holes 30A to the left ends in FIG. 1, and the extending/retracting rods 38A are extended again. Accordingly, the second pins 28A can be inserted into the positioning holes 12A, and the setting of the leading end portion of the photosensitive sheet 12 onto the drum 18 is completed (see FIG. 4).

In step 206, the position of the training roller 66 is set. The position is determined in advance by the materials and the like of the photosensitive sheet 12 and the ink sheet 50, and is set in accordance therewith. The angle at which the ink sheet 50 is peeled from the photosensitive sheet 12 is determined by this setting.

In step 208, the rotation of the heating/pressing roller 44 begins, and the process proceeds to step 210 where the heating/pressing roller 44 is moved to the position of contact with the drum 18. The process then proceeds to step 212. Because the relative speeds between the ink sheet 50 and the photosensitive sheet 12 must match when the ink from the ink sheet 50 is transferred to the photosensitive sheet 12, a structure must be provided in which the peripheral speeds of the drum 18 and the roller 44 are made to substantially coincide when the drum 18 and the roller 44 contact each other.

In step 212, the supply roller 52, the take-up roller 54 and the protective film take-up roller 60 respectively begin to rotate. The process proceeds to step 214 where the peeling claw 64 is moved to the position corresponding to the drum 18.

The above processes complete the preparation for the application of ink to the photosensitive sheet 12. The process proceeds to step 216 where the drum 18 is rotated. As the drum 18 rotates, the photosensitive sheet 12 is gradually trained around the peripheral surface of the drum 18. At this time, because the photosensitive sheet 12 is trained while being pressed to the drum 18 by the squeeze roller 42, the photosensitive sheet 12 is fit securely to the drum 18 without any air bubbles or the like forming therebetween. Further, because the suction grooves are formed in the peripheral surface of the drum 18, the trained state of the photosensitive sheet 12 which is trained around the drum 18 is maintained due to the suction by the suction grooves.

In step 218, a determination is made as to whether the drum 18 has reached a predetermined angle of rotation. If the answer to the determination is "Yes", the process proceeds to step 220 where operation of the image receiving sheet conveying unit 70 is begun.

Figure 5:
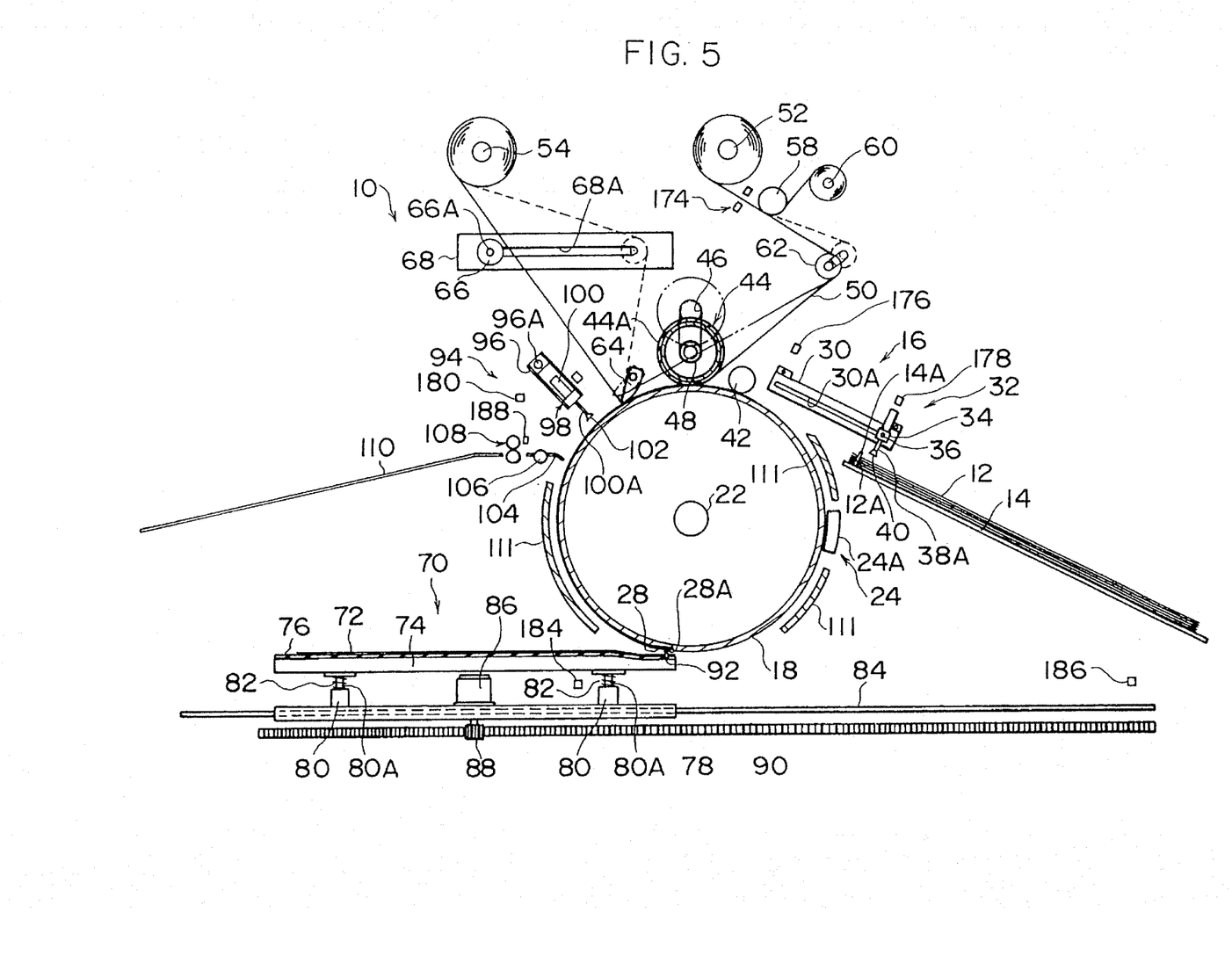
FIG. 5 is a schematic view relating to the first embodiment and illustrating a state at a beginning of fitting together the photosensitive sheet and an image receiving sheet.

Namely, the rotation of the drum 18 and the movement of the moving stand 78 are synchronous so that the leading end of the photosensitive sheet 12 trained around the drum 18 and the leading end of the image receiving sheet 72 are superposed so as to coincide with each other (see FIG. 5). At this time, the superposed photosensitive sheet 12 and image receiving sheet 72 are conveyed while a predetermined pressure is applied thereto due to the urging force of the compression coil springs 82 attached to the extending/retracting rods 80A of the air cylinders 80, and the ink adhering to the photosensitive sheet 12 is transferred to the image receiving sheet 72.

Figure 6:
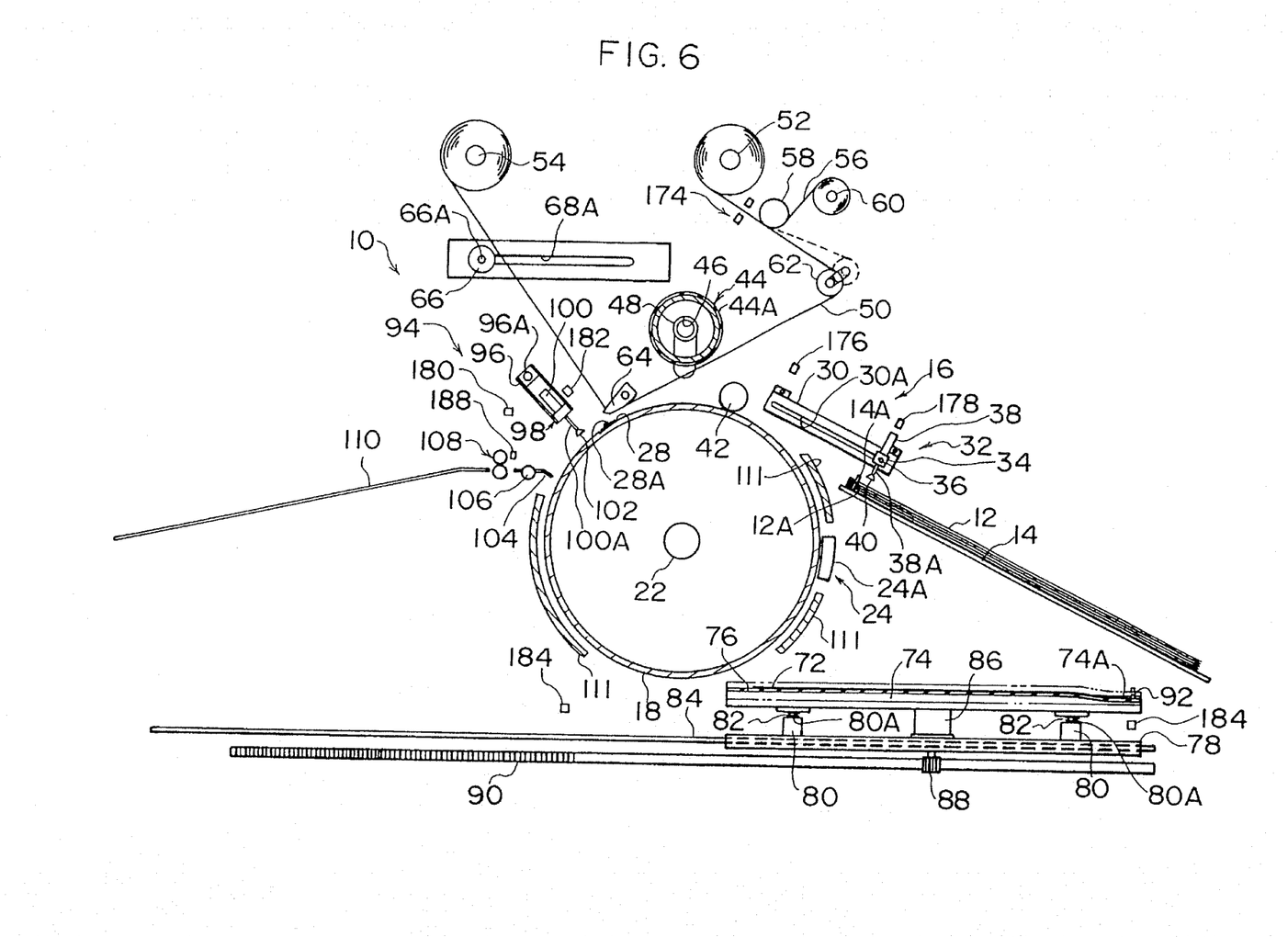
FIG. 6 is a schematic view relating to the first embodiment and illustrating a state when a loading stand of an image receiving sheet conveying unit is lowered.

When the loading stand 74, which has reached the right end in FIG. 1 of the guide rails 84, returns, the air cylinders 80 are operated so that the loading stand 74 is lowered (see FIG. 6). As a result, when the moving stand 78 returns to its original position, the moving stand 78 can return to the left end in FIG. 1 of the guide rails 84 without the loading stand 74 and the drum 18 contacting each other.

Due to the above processes, the image of the first color (e.g., Y dye) is transferred onto the image receiving sheet 72. Thereinafter, the remaining three colors (M, C, K) are successively transferred by the same processes. As a result, it is necessary to replace the photosensitive sheet 12 trained around the drum 18 with the photosensitive sheet 12 of the next color.

In step 222, a determination is made as to whether the angle of rotation of the drum 18 has reached the photosensitive sheet peeling position. When the answer to the determination is "Yes", the process proceeds to step 224 where the operation of the photosensitive sheet peeling unit 94 is begun.

Figure 7:
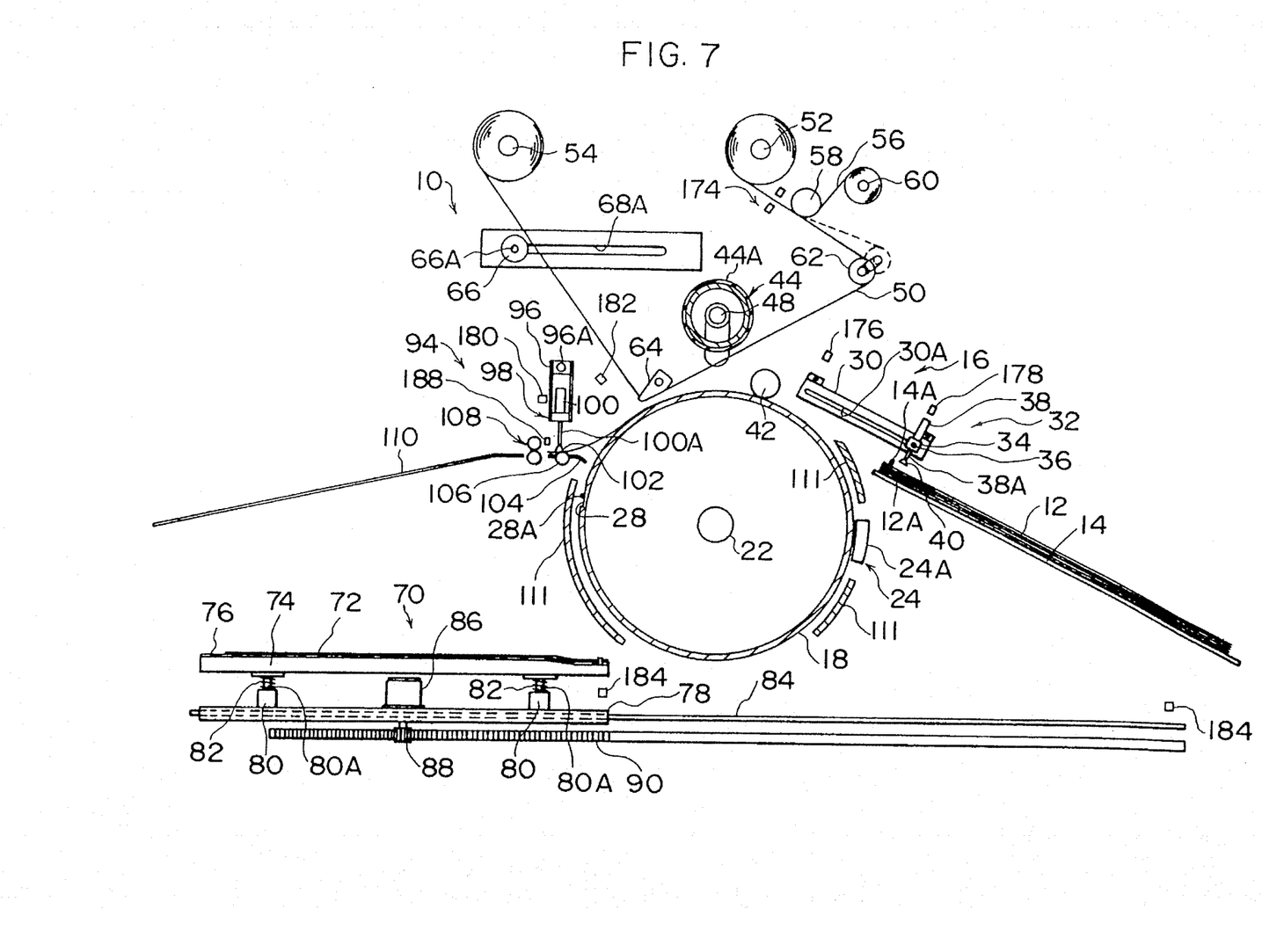
FIG. 7 is a schematic view relating to the first embodiment and illustrating a state in which the photosensitive sheet is peeled from the drum.

Namely, when the second pins 28A at the leading end of the photosensitive sheet 12 are positioned in the vicinity of the suction cup 102, the air cylinder 100 is operated so that the extending/retracting rod 100A is extended and the suction cup 102 is fit to the surface of the photosensitive sheet 12. In this state, due to operation of the negative pressure generating means, the photosensitive sheet 12 is sucked and held. The bracket 96 is pivoted to the position illustrated by the imaginary line in FIG. 1 (see FIG. 7). Thereafter, when the sucking of the photosensitive sheet 12 by the suction cup 102 is canceled, the photosensitive sheet 12 is supported by the guide plate 104 and the delivery roller 106 as the drum 18 rotates. The photosensitive sheet 12 reaches the nip rollers 108, is nipped thereby, and is delivered to the removal tray 110.

In subsequent step 226, a determination is made as to whether transfer of the four colors has been completed. If the answer to the determination is "No", the process moves to step 204, and the processes from the setting of the next photosensitive sheet 12 to the transfer onto the image receiving sheet 72 are repeated. When the answer to the determination in step 226 is "Yes", it is determined that the transfer of the four colors onto the image receiving sheet 72 has been completed, and the process proceeds to step 228. In step 228, a determination is made as to whether processing of the set number of color proofs has been completed. If the answer is "No", the process moves to step 204 after the image receiving sheet 72 has been replaced. If the answer to the determination in step 228 is "Yes", processing is completed. The photosensitive sheet which is set when the process moves to step 204 is a photosensitive sheet which was used previously. After the photosensitive sheet is set, it is trained around the rotating drum in accordance with the above-described routine, and ink of the appropriate color is transferred. The same image is thereby transferred to a new image receiving sheet. Accordingly, there is no need to effect color exposure for each color proof each time a plurality of color proofs are prepared, and a plurality of color proofs can be prepared in a relatively short time.

For example, after step 226, the actual paper (the paper which is to be used during actual printing) may be superposed on the image receiving sheet 72 loaded on the loading stand 74, and the moving stand 78 may again be moved reciprocally. In this way, the image on the image receiving sheet 72 can be transferred to the actual paper so that a color proof can be formed. It suffices that the transfer of the image onto the actual paper is not effected at the present device; the image receiving sheet 72 may be transported to another place and another device may be used.

In the present embodiment, the ink sheet 50 wound around the supply roller 52 and taken up by the take-up roller 54 corresponds to the photosensitive sheet 12 and is changed. However, there is no need to change the ink sheet if an ink sheet is used in which YMCK are applied in order along the longitudinal direction of the ink sheet 50.

In the first embodiment, the drum 18 has a metal surface, the metal outer surface of the heating/pressing roller 44 is covered by rubber, and the metal surface of the loading stand 74 of the image receiving sheet conveying unit 70 is covered by rubber. However, it suffices that the heating/pressing roller 44 and the loading stand 74 are metal surfaces, and that the surface of the drum 18 is covered by rubber.

Second Embodiment

Next, a second embodiment of the present invention will be described. As the structure of the device of the second embodiment is the same as that of the first embodiment, description thereof will be omitted.

The distinguishing feature of the second embodiment is that, when the respective colors are transferred onto the image receiving sheet 72, the same photosensitive sheet 12 and ink sheet 50 of the color corresponding thereto are used without the photosensitive sheet 12 being removed from the drum 18. Ink images of the same color are transferred onto the necessary number of image receiving sheets 72. Thereafter, the photosensitive sheet 12 and the ink sheet 50 of the next color are used, and the ink is transferred onto the image receiving sheets 72 used previously. These processes will be described hereinafter in accordance with the flowchart in FIG. 8. The letter "A" is added to the end of the step number of processes in FIG. 8 which are the same as those in the flowchart in FIG. 3. Description of these processes is omitted.

Figure 3:
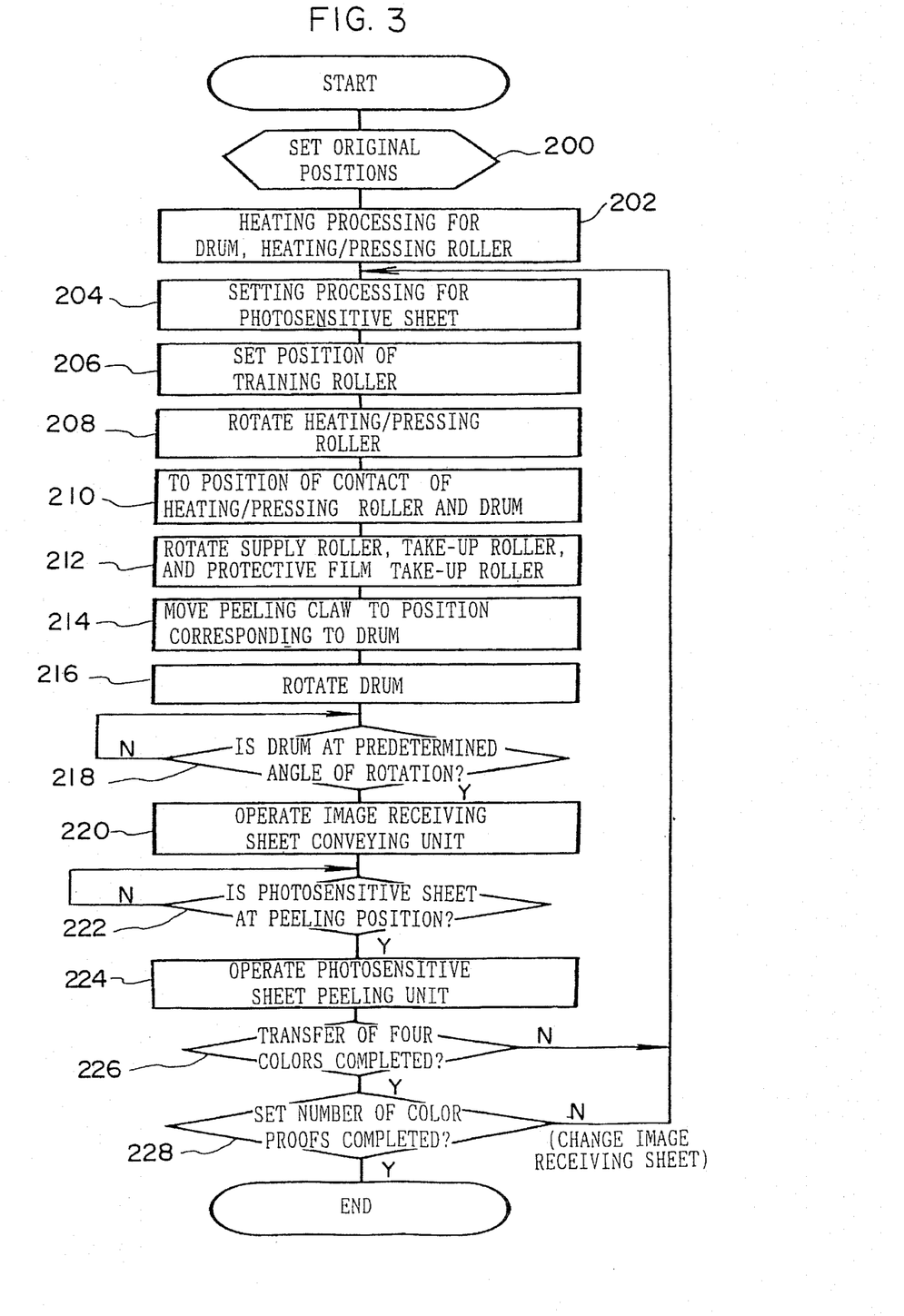
FIG. 3 is a control flowchart relating to the first embodiment.
Figure 4:
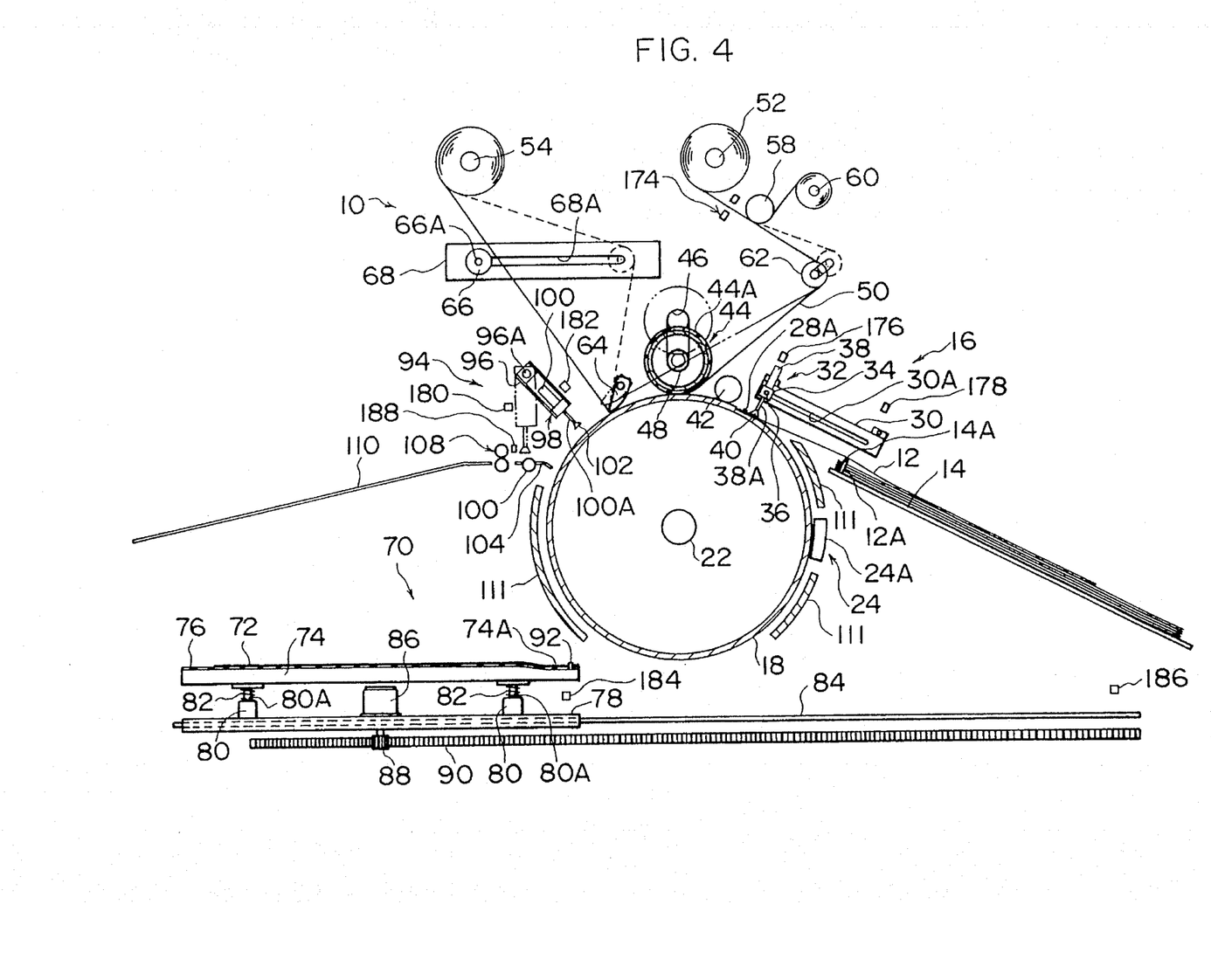
FIG. 4 is a schematic view relating to the first embodiment and illustrating a state in which a photosensitive sheet is made to correspond to a drum.
Figure 8:
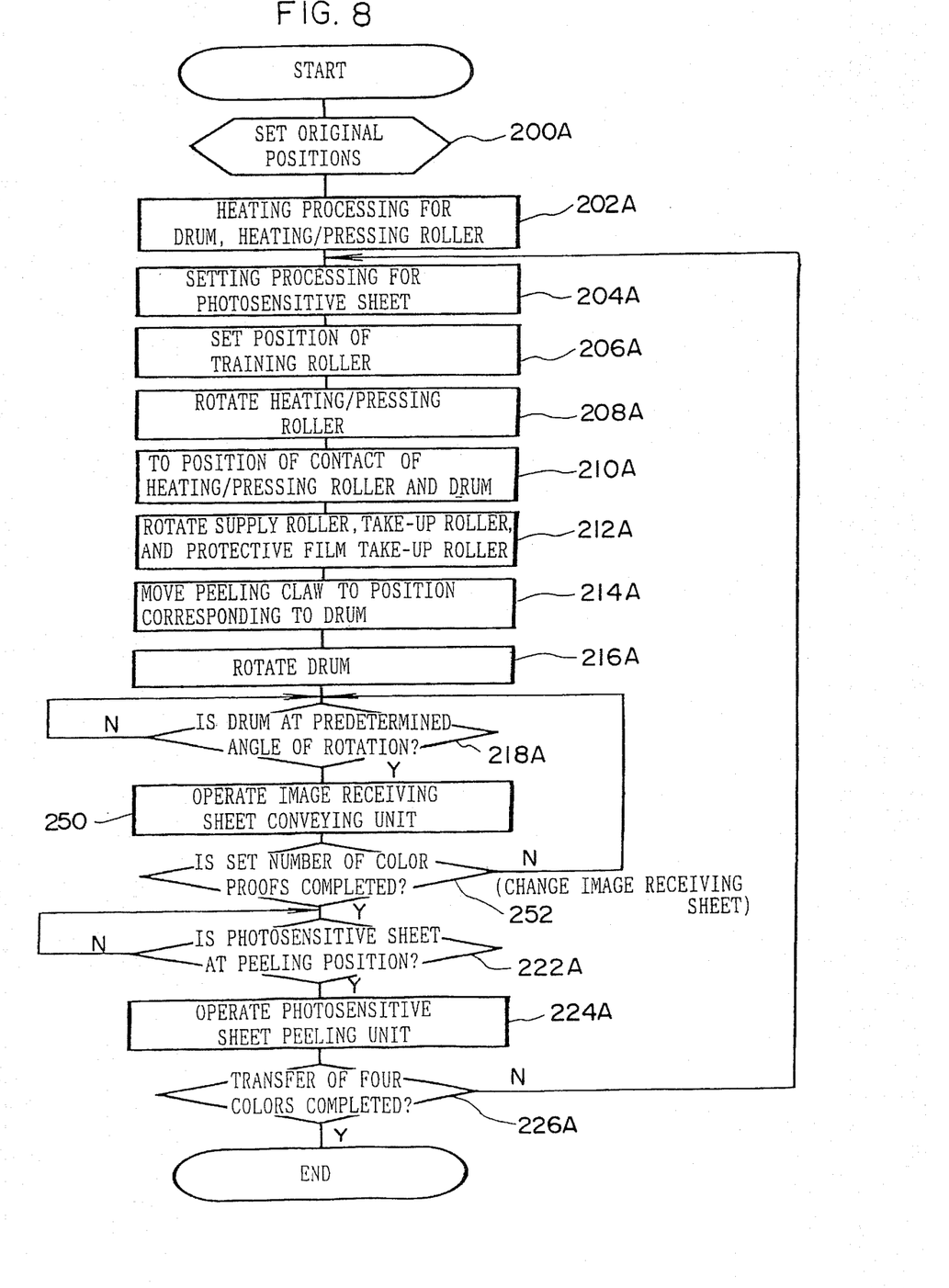
FIG. 8 is a control flowchart relating to a second embodiment.

Steps 200A through 218A are the same as the control of FIG. 3. When a determination is made in step 218A that the angle of rotation of the drum 18 has reached the predetermined angle, the image receiving sheet conveying unit 70 is moved is moved only one round trip in step 250. The process proceeds to step 252 where a determination is made as to whether the predetermined set number of color proofs has been reached. If the answer to the determination is "No", the image receiving sheet 72 on the loading stand 74 is replaced with a new image receiving sheet 72, and the process proceeds to step 218A. Namely, ink is transferred to a plurality of image receiving sheets 72 by the same photosensitive sheet 12. If the answer to the determination in step 252 is "Yes", the process proceeds to step 222A, and the photosensitive sheet 12 is replaced by the next photosensitive sheet 12 (steps 222A through 224A). In step 226A, a determination is made as to whether the four colors have been completed. If the answer to the determination is "No", the image receiving sheet 72, onto which one, two or three colors have been transferred, is again set on the loading stand 74, and the process moves to step 204A.

In this way, in the second embodiment, the image receiving sheets 72 are not finished one sheet at a time, but rather, each color is transferred continuously in accordance with the requisite number of sheets, and ultimately, the predetermined number of image receiving sheets is finished. Although the number of times the image receiving sheet 72 is set onto the loading stand 74 (i.e., manual operation) increases, the number of times that the photosensitive sheet 12 is set on and removed from the drum 18 decreases. Therefore, less time is required, and the work of accurately setting the photosensitive sheet on the drum can be effected automatically.

Third Embodiment

A third embodiment of the present invention will be described hereinafter. In the third embodiment, structural portions which are the same as those of the first embodiment are denoted by the same reference numerals, and description of their structures is omitted.

Figure 9:
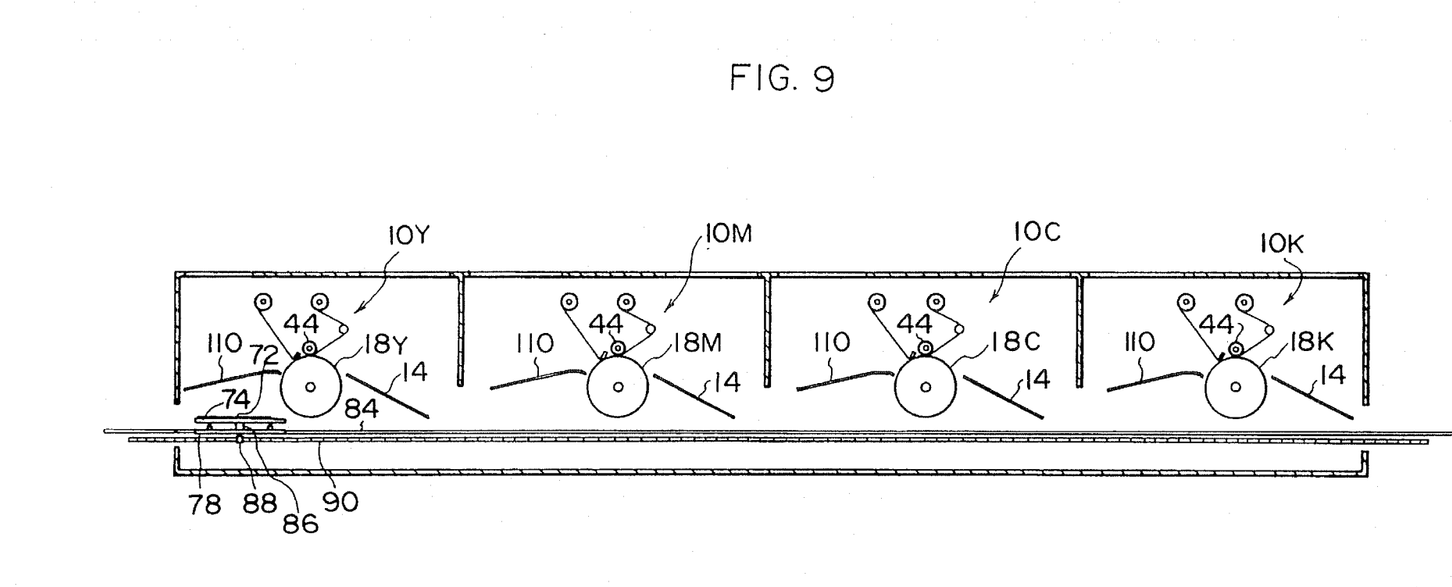
FIG. 9 is a schematic structural view of an image forming device relating to the third embodiment.

As illustrated in FIG. 9, in the apparatus relating to the third embodiment, four image forming devices 10 of the first embodiment, excepting the image receiving sheet conveying units 70, are disposed in a row. (Hereinafter, the image forming units from the left side of FIG. 9 will be denoted by reference numerals 10Y, 10M, 10C, 10K.)

The guide rails 84 and the rack 90 extend such that the image receiving sheet conveying unit 70 moves in a straight line in a direction tangent to the respective drums 18Y, 18M, 18C, 18K of the four image forming devices 10Y, 10M, 10C, 10K.

At the image forming apparatus 10Y, only the photosensitive sheet 12Y, on which the Y dye image formed by the ink receiving portions and the ink non-receiving portions is formed, is trained around the drum 1BY so that the ink of the Y dye is transferred to the image receiving sheet 72. Thereafter, the moving stand 78 corresponds to the image forming devices 10M, 10C, 10K so that the inks of the M, C, K dyes are transferred to the image receiving sheet 72 in that order. Inks of the four colors can be transferred onto a single image receiving sheet 72 by one round trip of the moving stand 78.

In the third embodiment, because the drums 18Y, 18M, 18C and 18K are provided so as to be used exclusively for the respective colors, the transfer of all of the colors can be effected in one round trip operation, rather than four round trips of the image receiving sheet 72. Therefore, the work efficiency improves.

In the above-described embodiments, sequence control, in which the respective driving systems are operated in accordance with signals from the sensors, is used so that the respective driving operations can be effected synchronously. However, a single driving source may be provided, and the respective driving operations can be interlocked mechanically so as to be synchronous.

What is claimed is:

1. An image forming device comprising:

a rotating drum having a peripheral surface around which an image forming material is trained, ink receiving portions and ink non-receiving portions being formed on said image forming material by at least one of exposure of a color separated original by active light and developing processing effected after said exposure, said ink receiving portions and said ink non-receiving portions corresponding to said color separated original;

an ink sheet conveying mechanism which conveys an ink sheet, said ink sheet comprising a supporting body having ink provided on a surface of said body, synchronously with rotation of said rotating drum;

ink transfer means for fitting together said image forming material, said image forming material being trained around said rotating drum, and said ink sheet, said ink sheet being conveyed by said ink sheet conveying mechanism, and transferring ink from said ink sheet to said ink receiving portions of said image forming material and said ink sheet in a state in which said image forming material and said ink sheet are fit together; and conveying means, having an image receiving material loading surface, for reciprocally moving an image receiving material provided on the loading surface in a direction tangent to the peripheral surface of said rotating drum synchronously with the rotation of said rotating drum, and fitting together said image receiving material with said image forming material to which the ink has been transferred by said ink transfer means, and for applying at least one of a predetermined pressure and a predetermined temperature to said image receiving material and said image forming material so that the ink is transferred from said image forming material to said image receiving material.

2. An image forming device according to claim 1, further comprising:

image forming material setting means for moving said image forming material to said rotating drum and positioning said image forming material at the peripheral surface of said rotating drum.

3. An image forming device according to claim 1, further comprising:

holding means for holding said image forming material on the peripheral surface of said rotating drum.

4. An image forming device according to claim 1, further comprising:

peeling means for peeling said ink sheet from said image forming material.

5. An image forming device according to claim 1, further comprising:

tension maintaining means for maintaining said ink sheet, said ink sheet being fitted to said image forming material, at a predetermined tension.

6. An image forming device which, after transferring inks corresponding to respective colors of color separated originals of each color to an image forming material, transfers the inks of the respective colors successively onto an image receiving material so that a color image corresponding to said color separated originals is formed on said image receiving material, said image forming device comprising:

a rotating drum having a peripheral surface around which an image forming material is trained, ink receiving portions and ink non-receiving portions being formed on said image forming material by at least one of exposure of a color separated original by active light and developing processing effected after said exposure, said ink receiving portions and said ink non-receiving portions corresponding to said color separated image, and a first positioning portion, engageable with a positioning portion provided at said image forming material, being provided at a portion of the peripheral surface of said rotating drum;

a loading stand on which a plurality of said image forming materials are loaded in a stacked and superposed state, said loading stand being provided with a second positioning portion which is engageable with said positioning portion provided at said image forming material;

image forming material setting means for removing said image forming material positioned on said loading stand by said second positioning portion, and for moving said image forming material to said rotating drum, and for positioning said image receiving material at the peripheral surface of said rotating drum by using said first positioning portion;

holding means for holding said image forming material set on the peripheral surface of said rotating drum by said image forming material setting means;

an ink sheet supply roller for supporting an ink sheet, said ink sheet comprising a supporting body having ink provided on a surface of said supporting body, in a state in which said ink sheet is wound in a roll;

ink transfer means for fitting together said image forming material and said ink sheet, and for effecting at least one of heating and pressing said image forming material and said ink sheet in a state in which said image forming material and said ink sheet are fit together, so that ink is transferred to said ink receiving portions of said image forming material;

peeling means for peeling said ink sheet from said image forming material;

a take-up roller for receiving and accommodating in a roll shape said ink sheet peeled by said peeling means;

tension maintaining means for maintaining said ink sheet between said supply roller and said take-up roller at a predetermined tension;

conveying means, provided with a loading surface upon which an image receiving material is loaded, for fitting together said image forming material on the peripheral surface of said rotating drum and said image receiving material on said loading surface, at a predetermined pressure, and reciprocally moving said image receiving material in a direction tangent to the peripheral surface of said rotating drum synchronously with rotation of said rotating drum.

7. An image forming device according to claim 6, further comprising:

an image forming material presser mechanism for pressing a leading end portion of said image forming material positioned by said first positioning portion, when said image forming material is moved to said rotating drum.

8. An image forming device according to claim 6, wherein said holding means comprises a suction portion which is provided at said rotating drum and which sucks and holds said image forming material by negative pressure.

9. An image forming device according to claim 6, wherein said ink transfer means is disposed for movement in a radial direction of said drum for separating said image forming material and said ink sheet.

10. An image forming device according to claim 6, wherein said peeling means comprises a cooling mechanism for cooling said ink sheet to facilitate peeling thereof.

11. An image forming device according to claim 6, wherein said peeling means comprising means for varying an angle at which said ink sheet is peeled from said image forming material.

12. An image forming device according to claim 6, wherein said conveying means comprises an elastic sheet which is disposed on said loading surface.

13. An image forming device according to claim 6, further comprising means for heating said loading surface of said conveying means to a maximum temperature of about 100° C.

14. An image forming device according to claim 6, further comprising means for separating said loading surface of said conveying means from the peripheral surface of said rotating drum when said conveying means returns from a position at which said conveying means is disposed after movement in the tangent direction to a position at which said conveying means is disposed before movement.

15. An image forming device according to claim 6, further comprising:

an image forming material peeling unit which peels said image forming material, for which transfer of ink to said image receiving material has been completed, from said rotating drum.

16. An image forming method comprising the steps of:

training an image forming material around a peripheral surface of a rotating drum, ink receiving portions and ink non-receiving portions being formed on said image forming material by at least one of exposure of a color separated original by active light and developing processing effected after said exposure, said ink receiving portions and said ink non-receiving portions corresponding to said color separated original;

conveying an ink sheet, said ink sheet comprising a supporting body having ink on a surface of said body, synchronously with rotation of said rotating drum;

fitting together said image forming material trained around said rotating drum and said ink sheet conveyed by an ink sheet conveying mechanism, and effecting at least one of heating and pressing said image forming material and said ink sheet in a state in which said image forming material and said ink sheet are fit together, so that ink from said ink sheet is transferred onto said ink receiving portions of said image forming material; and reciprocally moving an image receiving material in a direction tangent to the peripheral surface of said rotating drum synchronously with the rotation of said rotating drum, and fitting said image receiving material together with said image forming material, and applying at least one of a predetermined pressure and a predetermined temperature to said image forming material and said image receiving material so that ink is transferred from said image forming material to said image receiving material.

17. An image forming method according to claim 16, further comprising the step of continuously transferring inks of respective colors from said image forming materials to a single image receiving material.

18. An image forming method according to claim 17, further comprising the step of:

after the inks of respective colors have been transferred to the single image receiving material, superposing a paper on the image receiving material and fitting together and conveying the paper and the image receiving material such that an image on the image receiving material is transferred onto the paper.

19. An image forming method according to claim 16, further comprising the step of continuously transferring ink of the same color from an image forming material to a predetermined number of image receiving materials.

\* \* \* \* \*